US008786043B2

(12) United States Patent
Huang et al.

(10) Patent No.: US 8,786,043 B2
(45) Date of Patent: Jul. 22, 2014

(54) HIGH PERFORMANCE GESI AVALANCHE PHOTODIODE OPERATING BEYOND GE BANDGAP LIMITS

(75) Inventors: Mengyuan Huang, Beijing (CN); Pengfei Cai, Beijing (CN); Dong Pan, Andover, MA (US)

(73) Assignee: SiFotonics Technologies Co, Ltd., Woburn, MA (US)

( * ) Notice: Subject to any disclaimer, the term of this patent is extended or adjusted under 35 U.S.C. 154(b) by 0 days.

(21) Appl. No.: 13/604,911

(22) Filed: Sep. 6, 2012

(65) Prior Publication Data

US 2013/0292741 A1    Nov. 7, 2013

Related U.S. Application Data

(60) Provisional application No. 61/688,059, filed on May 5, 2012.

(51) Int. Cl.
*H01L 31/107*    (2006.01)

(52) U.S. Cl.
USPC .......... 257/438; 257/431; 257/436; 257/441; 257/E31.063

(58) Field of Classification Search
CPC . H01L 27/14; H01L 27/14692; H01L 31/028; H01L 31/0376; H01L 31/107; H01L 31/1075
USPC ................... 257/186, 438, E31.063, 431, 441
See application file for complete search history.

(56) References Cited

U.S. PATENT DOCUMENTS

| | | | |
|---|---|---|---|
| 2005/0051861 A1* | 3/2005 | Shi et al. | 257/438 |
| 2007/0141744 A1* | 6/2007 | Lee et al. | 438/64 |
| 2008/0019410 A1* | 1/2008 | Onishi | 372/45.01 |
| 2011/0164643 A1* | 7/2011 | Tohyama et al. | 372/49.01 |
| 2011/0227116 A1* | 9/2011 | Saito et al. | 257/98 |

* cited by examiner

*Primary Examiner* — Matthew Landau
*Assistant Examiner* — Mark Hatzilambrou
(74) *Attorney, Agent, or Firm* — Andy M. Han (57) ABSTRACT

Avalanche photodiodes (APDs) having at least one top stressor layer disposed on a germanium (Ge)-containing absorption layer are described herein. The top stressor layer can increase the tensile strain of the Ge-containing absorption layer, thus extending the absorption of APDs to longer wavelengths beyond 1550 nm. In one embodiment, the top stressor layer has a four-layer structure, including an amorphous silicon (Si) layer disposed on the Ge-containing absorption layer; a first silicon dioxide ($SiO_2$) layer disposed on the amorphous Si layer, a silicon nitride (SiN) layer disposed on the first $SiO_2$ layer, and a second $SiO_2$ layer disposed on the SiN layer. The Ge-containing absorption layer can be further doped by p-type dopants. The doping concentration of p-type dopants is controlled such that a graded doping profile is formed within the Ge-containing absorption layer to decrease the dark currents in APDs.

20 Claims, 10 Drawing Sheets

HIGH PERFORMANCE GESI AVALANCHE PHOTODIODE OPERATING BEYOND GE BANDGAP LIMITS

CROSS-REFERENCE TO RELATED PATENT APPLICATIONS

This application claims the priority benefit of U.S. Patent Application Ser. No. 61/688,059, entitled "Increase Tensile Strain in Ge Layer by Top Stressor Layers", filed on May 5, 2012, which is herein incorporated in its entirety by reference.

TECHNICAL FIELD

The present disclosure relates to photosensitive devices. More particularly, the present disclosure relates to an avalanche photodiode.

BACKGROUND

An avalanche photodiode (APD) is a type of photosensitive semiconductor device in which light is converted to electricity due to the photoelectric effect coupled with electric current multiplication as a result of avalanche breakdown. APDs differ from conventional photodiodes in that incoming photons internally trigger a charge avalanche in APDs, thus APDs can measure light of even lower level and are widely used in long-distance optical communications and optical distance measurement where high sensitivity is needed.

Germanium/Silicon (GeSi) APDs combine the characteristic of excellent optical absorption of Ge at telecommunication wavelength with the characteristic of outstanding carrier multiplication properties of Si. The use of Ge allows the extension of the spectral response of GeSi APDs to longer wavelengths, up to 1550 nm. However, the absorption of bulk Ge ceases at 1550 nm at room temperature, which is limited by its bandgap in Gamma band. Since there is a requirement for the optical band in optical communication systems to cover a wide wavelength range, from 1260 nm to 1620 nm, the longer wavelength limitation of optical absorption of Ge is a main reason restricting the wide application of GeSi APDs in optical communication systems. Therefore, there is a need to extend the absorption of Ge to longer wavelengths above 1550 nm.

One of the parameters that impact the applicability and usefulness of APDs is dark current. Dark current is a relatively small electric current that flows through a photosensitive device, such as a photodiode, even when no photons are entering the photosensitive device. Dark current is one of the major sources of noise in photosensitive devices. Consequently, dark current is a limiting factor for GeSi APDs in high-speed optical communication applications. Therefore, there is a need to reduce the dark current to achieve high performance in APDs.

SUMMARY

The present disclosure provides APDs having at least one top stressor layer disposed on the light absorption layer. The top stressor layer can increase the tensile strain of the absorption layer. As a result, the absorption layer can absorb light with wavelengths beyond its optical bandgap. The absorption layer can be further doped with p-type dopants. The doping concentration of the p-type dopants is controlled such that a graded doping profile is formed within the absorption layer to decrease the dark currents of APDs.

In one aspect, an APD may comprise a substrate and a multi-layer structure disposed on a first surface of the substrate. The multi-layer structure may comprise: at least one top stressor layer, the at least one top stressor layer is coupled to at least one metal contact of a first electrical polarity; a germanium (Ge)-containing absorption layer on which the at least one top stressor layer is disposed; a charge layer on which the Ge-containing absorption layer is disposed; a multiplication layer on which the charge layer is disposed; and a contact layer on which the multiplication layer is disposed, the contact layer is coupled to at least one metal contact of a second electrical polarity opposite to the first electrical polarity. The at least one top stressor layer is configured to increase a tensile strain of the Ge-containing absorption layer.

In some embodiments, the at least one top stressor layer may comprise: an amorphous silicon (Si) layer disposed on the Ge-containing absorption layer; a first silicon dioxide ($SiO_2$) layer disposed on the amorphous Si layer; a silicon nitride (SiN) layer disposed on the first $SiO_2$ layer; and a second $SiO_2$ layer disposed on the SiN layer.

In some embodiments, the Ge-containing absorption layer may comprise Ge, germanium-silicon (GeSi), or silicon-germanium-carbon (SiGeC). In some embodiment, the charge layer may comprise p-type Si, p-type GeSi, or p-type SiGeC.

In some embodiments, the multiplication layer may comprise intrinsic Si or lightly doped n-type Si.

In some embodiments, the contact layer may comprise n-type Si.

In some embodiments, the substrate may comprise a Si substrate or a silicon-on-insulator (SOI) substrate.

In some embodiments, the APD may additionally comprise at least one anti-reflection layer disposed on a second surface of the substrate opposite to the first surface. The at least one anti-reflection layer may comprise a single $SiO_2$ layer or three layers comprising a SiN layer disposed between two $SiO_2$ layers.

In some embodiments, the Ge-containing absorption layer may further comprise p-type dopants; a doping concentration of the p-type dopants is controlled such that a graded doping profiled of the p-type dopants is formed inside the Ge-containing absorption layer.

In some embodiments, the p-type dopants may comprise gallium (Ga) or boron (B).

In another aspect, an APD may comprise a substrate and a multi-layer structure disposed on a first surface of the substrate. The multi-layer structure may comprise: at least one top stressor layer, the at least one top stressor layer is coupled to at least one metal contact of a first electrical polarity; a Ge absorption layer on which the at least one top stressor layer is disposed; a charge layer on which the Ge absorption layer is disposed; a multiplication layer on which the charge layer is disposed; and a contact layer on which the multiplication layer is disposed, the contact layer is coupled to at least one metal contact of a second electrical polarity opposite to the first electrical polarity. The at least one top stressor layer is configured to increase a tensile strain of the Ge absorption layer.

In some embodiments, the at least one top stressor layer may comprise: an amorphous Si layer disposed on the Ge absorption layer; a first $SiO_2$ layer disposed on the amorphous Si layer; a SiN layer disposed on the first $SiO_2$ layer; and a second $SiO_2$ layer disposed on the SiN layer.

In some embodiment, the charge layer may comprise p-type Si, p-type GeSi, or p-type SiGeC, the multiplication layer may comprise intrinsic Si or lightly doped n-type Si, and the contact layer may comprise n-type Si.

In some embodiments, the substrate may comprise a Si substrate or a SOI substrate.

In some embodiments, the APD may additionally comprise at least one anti-reflection layer disposed on a second surface of the substrate opposite to the first surface. The at least one anti-reflection layer may comprise a single $SiO_2$ layer or three layers comprising a SiN layer disposed between two $SiO_2$ layers.

In some embodiments, the Ge absorption layer may further comprise p-type dopants; a doping concentration of the p-type dopants is controlled such that a graded doping profile of the p-type dopants is formed inside the Ge absorption layer.

In some embodiments, the p-type dopants may comprise Ga or B.

In yet another aspect, an APD may comprise a substrate and a multi-layer structure disposed on the substrate. The multi-layer structure may comprise: at least one top stressor layer, the at least one top stressor layer is coupled to at least one metal contact of a first electrical polarity; a Ge-containing absorption layer doped by p-type dopants on which the at least one top stressor layer is disposed, a doping concentration of the p-type dopants is controlled such that a graded doping profile of the p-type dopants is formed within the Ge-containing absorption layer; a charge layer on which the Ge-containing absorption layer is disposed; a multiplication layer on which the charge layer is disposed; and a contact layer on which the multiplication layer is disposed, the contact layer is coupled to at least one metal contact of a second electrical polarity opposite to the first electrical polarity. The at least one top stressor layer is configured to increase a tensile strain of the Ge-containing absorption layer.

In some embodiments, the at least one top stressor layer may comprise: an amorphous Si layer disposed on the absorption layer; a first $SiO_2$ layer disposed on the amorphous Si layer; a SiN layer disposed on the first $SiO_2$ layer; and a second $SiO_2$ layer disposed on the SiN layer.

In some embodiments, the Ge-containing absorption layer may comprise Ge, GeSi, or SiGeC, and the p-type dopants may comprise Ga or B.

These and other features, aspects, and advantages of the present disclosure will be explained below with reference to the following figures. It is to be understood that both the foregoing general description and the following detailed description are by examples, and are intended to provide further explanation of the present disclosure as claimed.

BRIEF DESCRIPTION OF THE DRAWINGS

The accompanying drawings are included to provide a further understanding of the present disclosure, and are incorporated in and constitute a part of this specification. The drawings illustrate embodiments of the present disclosure and, together with the description, serve to explain the principles of the present disclosure. The drawings may not necessarily be in scale so as to better present certain features of the illustrated subject matter.

DETAILED DESCRIPTION OF THE PREFERRED EMBODIMENTS

Overview

The present disclosure provides avalanche photodiodes (APDs) having top stressor layers disposed on an absorption layer that can increase the tensile strains of the absorption layer. As a result, the optical absorption in wavelengths beyond the optical bandgap of the absorption layer is enhanced to achieve high device performance. Illustrative APDs of the present disclosure are schematically shown in cross-sectional views in FIGS. 1-4. FIGS. 1-4 are not drawn to scale and are provided to convey the concept of the various embodiments of the present disclosure.

Exemplary Embodiments

Figure 1A:
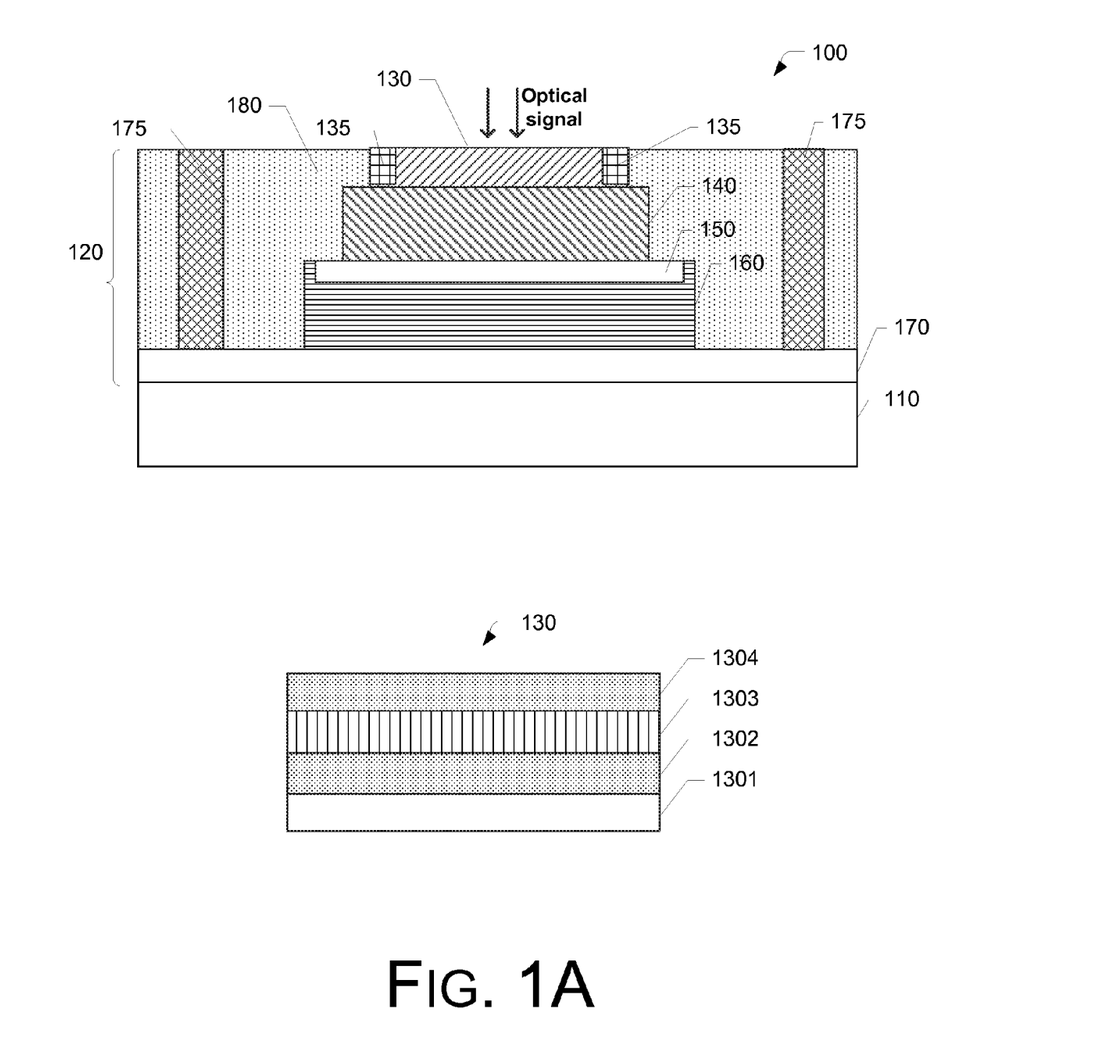
FIG. 1A is a cross-sectional view of an APD in accordance with some embodiments of the present disclosure.

FIG. 1A is a cross-sectional view of an APD 100 in accordance with an embodiment of the present disclosure. Referring to FIG. 1, the APD 100 may comprise a substrate 110 and a multi-layer structure 120 disposed on the substrate 110. The multi-layer structure 120 may comprise: a top stressor layer 130 electrically coupled to one or more one first-type metal contacts 135 of a first electrical polarity, an absorption layer 140 on which the top stressor layer 130 is disposed, a charge layer 150 on which the absorption layer 140 is disposed, a multiplication layer 160 on which the charge layer 150 is disposed, and a contact layer 170 on which the multiplication layer 160 is disposed. One or more second-type metal contacts 175 of a second electrical polarity are electrically coupled to the contact layer 170. The second electrical polarity is opposite to the first electrical polarity. For example, the one or more first-type metal contacts 135 are p-type and the one or more second-type metal contacts 175 are n-type, or vice versa. The APD 100 may further comprise an oxide coating 180 that covers the multi-layer structure 120.

The top stressor layer 130 increases the tensile strain of the absorption layer 140, thus greatly enhancing optical absorption in wavelengths beyond the optical bandgap of the absorption layer 140. The top stressor layer 130 also serves as an anti-reflection layer to improve the quantum efficiency of the APD 100. The top stressor layer 130 can be a single-layer or multi-layer structure. In one embodiment, the top stressor layer 130 has a multi-layer structure comprising four layers, including an amorphous silicon (Si) layer 1301 disposed on the absorption layer 140; a first silicon dioxide ($SiO_2$) layer 1302 disposed on the amorphous Si layer 1301; a silicon nitride (SiN) layer 1303 disposed on the first $SiO_2$ layer 1302; and a second $SiO_2$ layer 1304 disposed on the SiN layer 1303. The amorphous Si layer is electrically coupled to the one or more first-type metal contracts 135.

In one embodiment, the absorption layer 140 includes germanium (Ge), germanium-silicon (GeSi), or silicon-germanium-carbon (SiGeC). In one embodiment, the charge layer 150 includes p-type Si, p-type GeSi, or p-type SiGeC. In one embodiment, the multiplication layer 160 includes intrinsic Si or lightly doped n-type Si. In one embodiment, the contact layer 170 includes n-type Si. In one embodiment, the substrate 110 includes a Si substrate or a silicon-on-insulator (SOI) substrate.

Figure 1B:
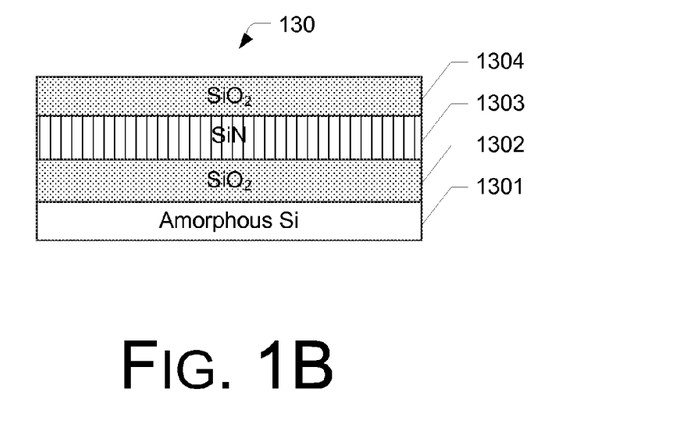
FIG. 1B is a cross-sectional view of an APD in accordance with an exemplary embodiment of the present disclosure.

FIG. 1B illustrates an exemplary embodiment of the APD 100. In the illustrated embodiment, the top stressor layer 130 is electrically coupled to two p-type metal contacts 135, the absorption layer 140 is a Ge absorption layer, the charge layer 150 is a p-type Si layer, the multiplication layer 160 is a Si multiplication layer, and the contact layer 170 is an n-type Si layer. The contact layer 170 is electrically coupled to two n-type metal contacts 175.

Figure 2A:
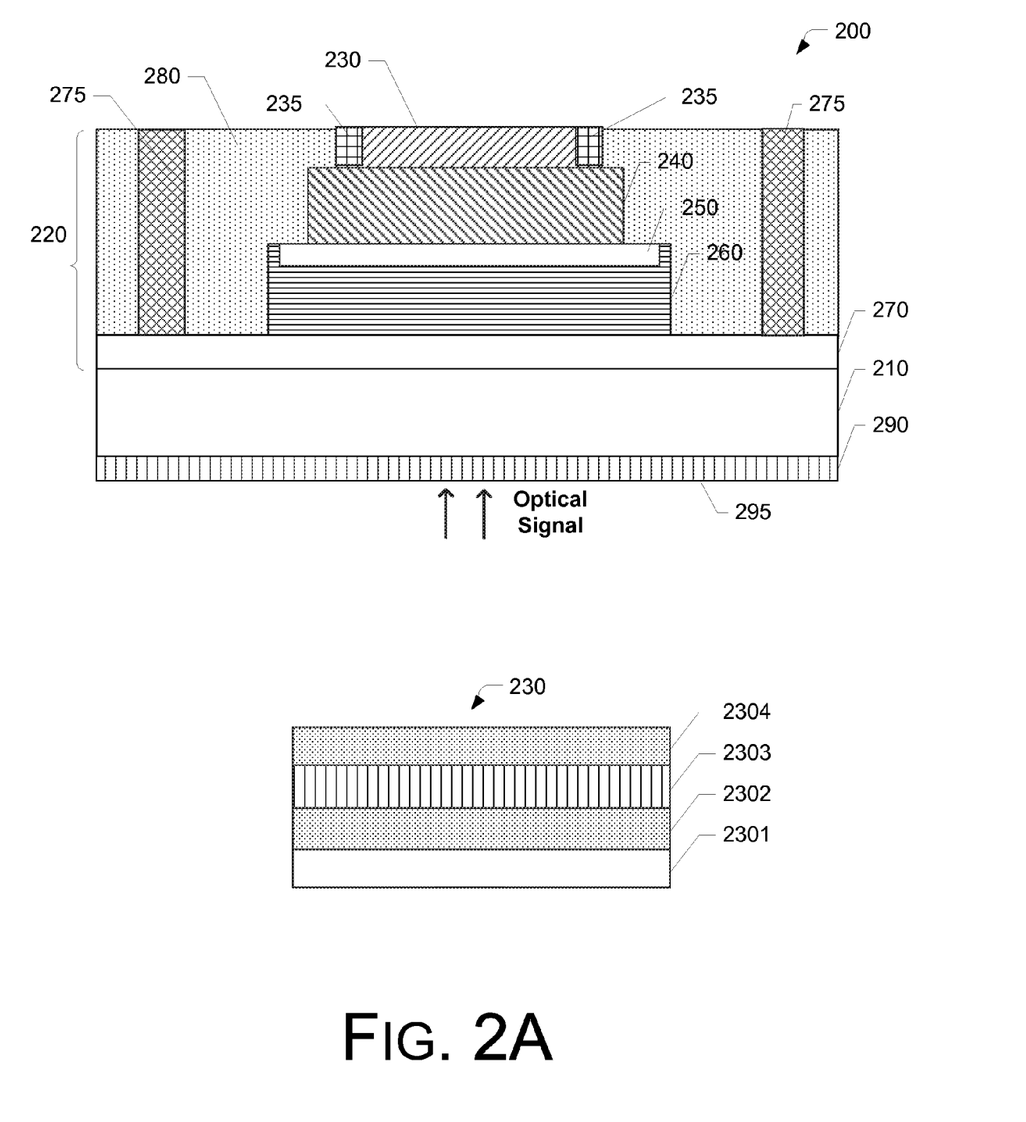
FIG. 2A is a cross-sectional view of an APD in accordance with some embodiments of the present disclosure.

FIG. 2A is a cross-sectional view of an APD 200 in accordance with an embodiment of the present disclosure. Referring to FIG. 2A, the APD 200 may comprise a substrate 210, a multi-layer structure 220 disposed on a first surface of the substrate 210, and an anti-reflection layer 290 disposed on a second surface of the substrate 210 opposite to the first surface. The multi-layer structure 220 may comprise: a top stressor layer 230 electrically coupled to one or more first-type metal contacts 235 of a first electrical polarity, an absorption layer 240 on which the top stressor layer 230 is disposed, a charge layer 250 on which the absorption layer 240 is disposed, a multiplication layer 260 on which the charge layer 250 is disposed, and a contact layer 270 on which the multiplication layer 260 is disposed. One or more second-type metal contacts 275 of a second electrical polarity are electrically coupled to the contact layer 270. The second electrical polarity is opposite to the first electrical polarity. For example, the one or more first-type metal contacts 235 are p-type and the one or more second-type metal contacts 275 are n-type, or vice versa. The APD 200 may further comprise an oxide coating 280 that covers the multi-layer structure 220.

The anti-reflection layer 290 can be a single-layer or multi-layer structure. In one embodiment, the anti-reflection layer 290 is a single $SiO_2$ layer. In another embodiment, the anti-reflection layer 290 has three layers, including a SiN layer disposed between two $SiO_2$ layers.

The top stressor layer 230 increases the tensile strain of the absorption layer 240, thus greatly enhancing optical absorption in wavelengths beyond the optical bandgap of the absorption layer 240. The top stressor layer 230 also serves as an anti-reflection layer to improve the quantum efficiency of the APD 200. The top stressor layer 230 can be a single-layer or multi-layer structure. In one embodiment, the top stressor layer 230 has a multi-layer structure comprising four layers, including an amorphous Si layer 2301 disposed on the absorption layer 240; a first $SiO_2$ layer 2302 disposed on the amorphous Si layer 2301; a SiN layer 2303 disposed on the first $SiO_2$ layer 2302; and a second $SiO_2$ layer 2304 disposed on the SiN layer 2303. The amorphous Si layer is electrically coupled to the one or more first-type metal contracts 235.

In one embodiment, the absorption layer 240 includes Ge, GeSi, or SiGeC. In one embodiment, the charge layer 250 includes p-type Si p-type GeSi, or p-type SiGeC. In one embodiment, the multiplication layer 260 includes intrinsic Si, or lightly doped n-type Si. In one embodiment, the contact layer 270 includes n-type Si. In one embodiment, the substrate 210 includes a Si substrate or an SOI substrate.

Figure 2B:
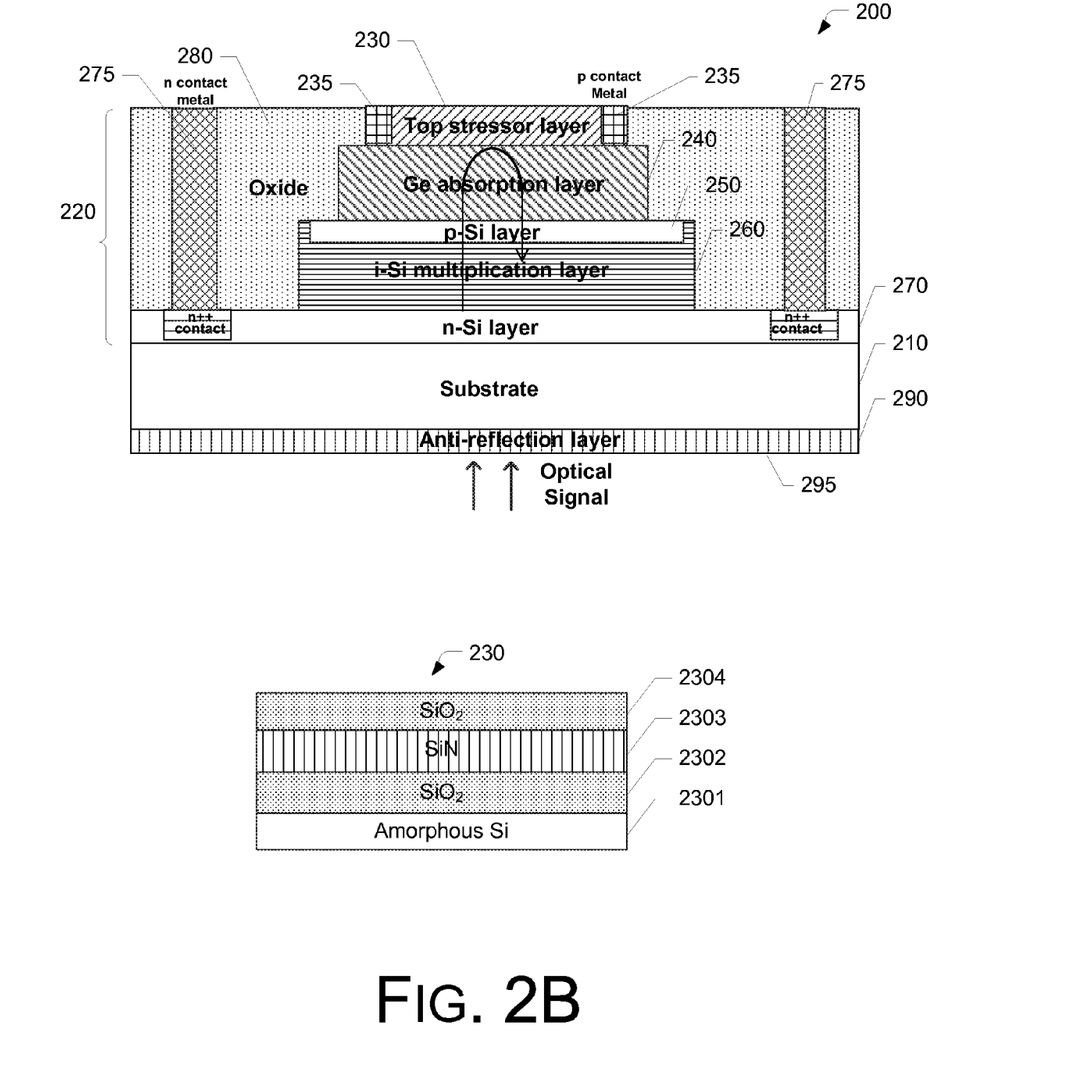
FIG. 2B is a cross-sectional view of an APD in accordance with an exemplary embodiment of the present disclosure.

FIG. 2B illustrates an exemplary embodiment of the APD 200. In the illustrated embodiment, the top stressor layer 230 is electrically coupled to two p-type metal contacts 235, the absorption layer 240 is a Ge absorption layer, the charge layer 250 is a p-type Si layer, the multiplication layer 260 is a Si multiplication layer, and the contact layer 270 is an n-type Si layer. The contact layer 270 is electrically coupled to two n-type metal contacts 275.

In comparison with the APD 100, the APD 200 in accordance with FIGS. 2A-2B further comprises the anti-reflection layer 290. Incoming Light of optical signals may be illuminated from the side of the anti-reflection layer 290 to enter into the APD 200. Thus, the anti-reflection layer 290 helps avoid optical loss at the incident surface 295. Moreover, when operating under this bottom illumination condition, the optical absorption of the APD 200 can be further increased. Due to the presence of the highly reflective top stressor layer 230, a major portion of the optical signals that has already passed through the absorption layer 240 will be reflected back into the absorption layer 240, thus effectively increasing optical absorptions of the absorption layer 240, especially for those wavelengths beyond the bandgap limits of the absorption layer 240.

Figure 3A:
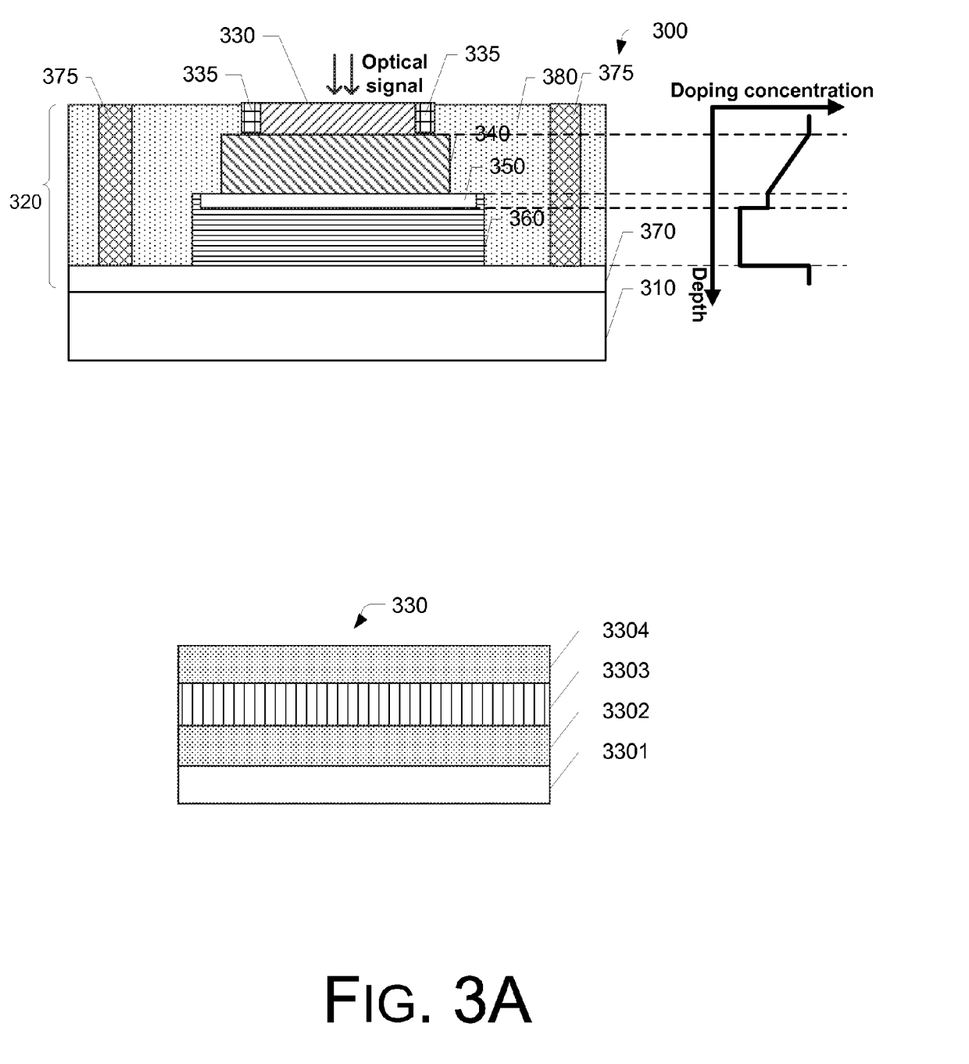
FIG. 3A is a cross-sectional view of an APD in accordance with some embodiments of the present disclosure.

FIG. 3A is a cross-sectional view of an APD 300 in accordance with an embodiment of the present disclosure. Referring to FIG. 3A, the APD 300 may comprise a substrate 310 and a multi-layer structure 320 disposed on the substrate 310. The multi-layer structure 320 may comprise: a top stressor layer 330 electrically coupled to one or more first-type metal contacts 335 of a first electrical polarity, an absorption layer 340 doped with first-type dopants and on which the top stressor layer 330 is disposed, a charge layer 350 on which the absorption layer 340 is disposed, a multiplication layer 360 on which the charge layer 350 is disposed, and a contact layer 370 on which the multiplication layer 360 is disposed. One or more second-type metal contacts 375 of a second electrical polarity are electrically coupled to the contact layer 370. The second electrical polarity is opposite to the first electrical polarity. For example, the one or more first-type metal contacts 335 are p-type and the one or more second-type metal contacts 375 are n-type, or vice versa. The APD 300 may further comprise an oxide coating 380 that covers the multi-layer structure 320. The doping concentration of the first-type dopants in the absorption layer 340 is controlled such that a graded doping profile of the first-type dopants is formed within the absorption layer 340. The graded doping profile of the first-type dopants is shown in FIG. 3A. For example, the first-type dopants are p-type dopants.

The top stressor layer 330 increases the tensile strain of the absorption layer 340, thus greatly enhancing optical absorption in wavelengths beyond the optical bandgap of the absorption layer 340. The top stressor layer 330 also serves as an anti-reflection layer to improve the quantum efficiency of the APD 300. The top stressor layer 330 can be a single-layer or multi-layer structure. In one embodiment, the top stressor layer 330 has a multi-layer structure comprising four layers, including an amorphous Si layer 3301 disposed on the absorption layer 340; a first $SiO_2$ layer 3302 disposed on the amorphous Si layer 3301; a SiN layer 3303 disposed on the first $SiO_2$ layer 3302; and a second $SiO_2$ layer 3304 disposed on the SiN layer 3303. The amorphous Si layer is electrically coupled to the one or more first-type metal contracts 335.

In one embodiment, the absorption layer 340 includes Ge, GeSi, or SiGeC. In one embodiment, the charge layer 350 includes p-type Si, p-type GeSi, or p-type SiGeC. In one embodiment, the multiplication layer 360 includes intrinsic Si, or lightly doped n-type Si. In one embodiment, the contact layer 370 includes n-type Si. In one embodiment, the substrate 310 includes a Si substrate or an SOI substrate. In one embodiment, the p-type dopants include gallium (Ga) or boron (B).

Figure 3B:
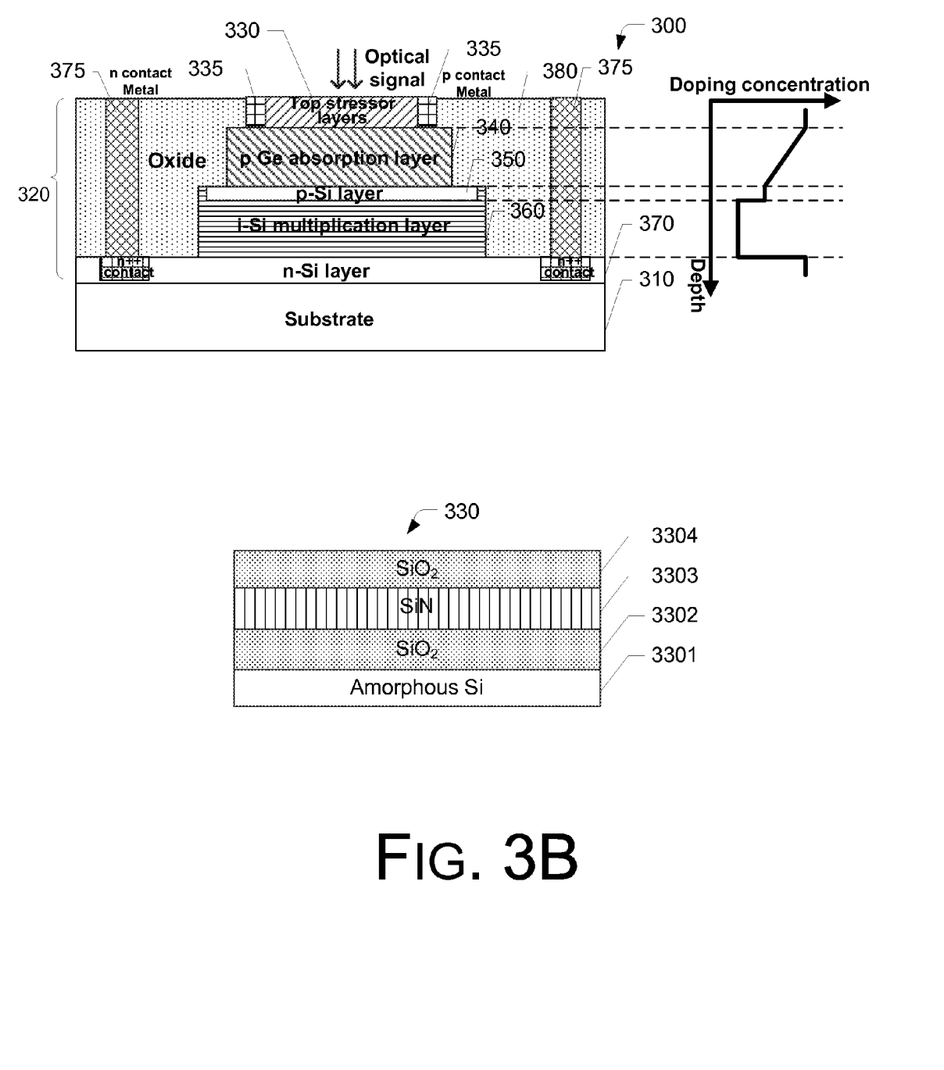
FIG. 3B is a cross-sectional view of an APD in accordance with an exemplary embodiment of the present disclosure.

FIG. 3B illustrates an exemplary embodiment of the APD 300. In the illustrated embodiment, the top stressor layer 330 is electrically coupled to two p-type metal contacts 335, the absorption layer 340 is a p-type Ge absorption layer, the charge layer 350 is a p-type Si layer, the multiplication layer 360 is a Si multiplication layer, and the contact layer 370 is an n-type Si layer. The contact layer 370 is electrically coupled to two n-type metal contacts 375.

In comparison with the APD 100, the APD 300 in accordance with FIGS. 3A-3B has an undepleted absorption layer 340 with a graded doping profile for reducing the electrical field and dark current within the absorption layer 340. The graded first-type doping of the absorption layer 340 can be achieved by in-situ doping or ion implantation. The graded doping profile of the first-type dopants formed in the absorption layer 340 can generate a built-in electrical field. This electrical field is mainly dependent on doping gradients and is independent on external applied bias. For example, as shown in FIG. 3B, with a proper design of the doping profile in the p-type Ge absorption layer 340, the built-in electrical field can reach several kV/cm in the p-type Ge absorption layer 340, thus ensuring carriers drift velocities close to saturation velocities. As a result, with extremely low dark current, GeSi APDs with an undepleted absorption layer can operate at a high speed condition like conventional GeSi APDs.

Moreover, considering the electrical field inside the p-type Ge absorption layer 340, the built-in electrical field (~several kV/cm) in the APD 300 is much weaker than that of the conventional GeSi APDs (~100 kV/cm). Since dark currents in GeSi APDs are mainly depended on the electrical field inside the Ge absorption layer, GeSi APDs with an undepleted absorption layer can significantly reduce dark currents in GeSi APDs.

Figure 4A:
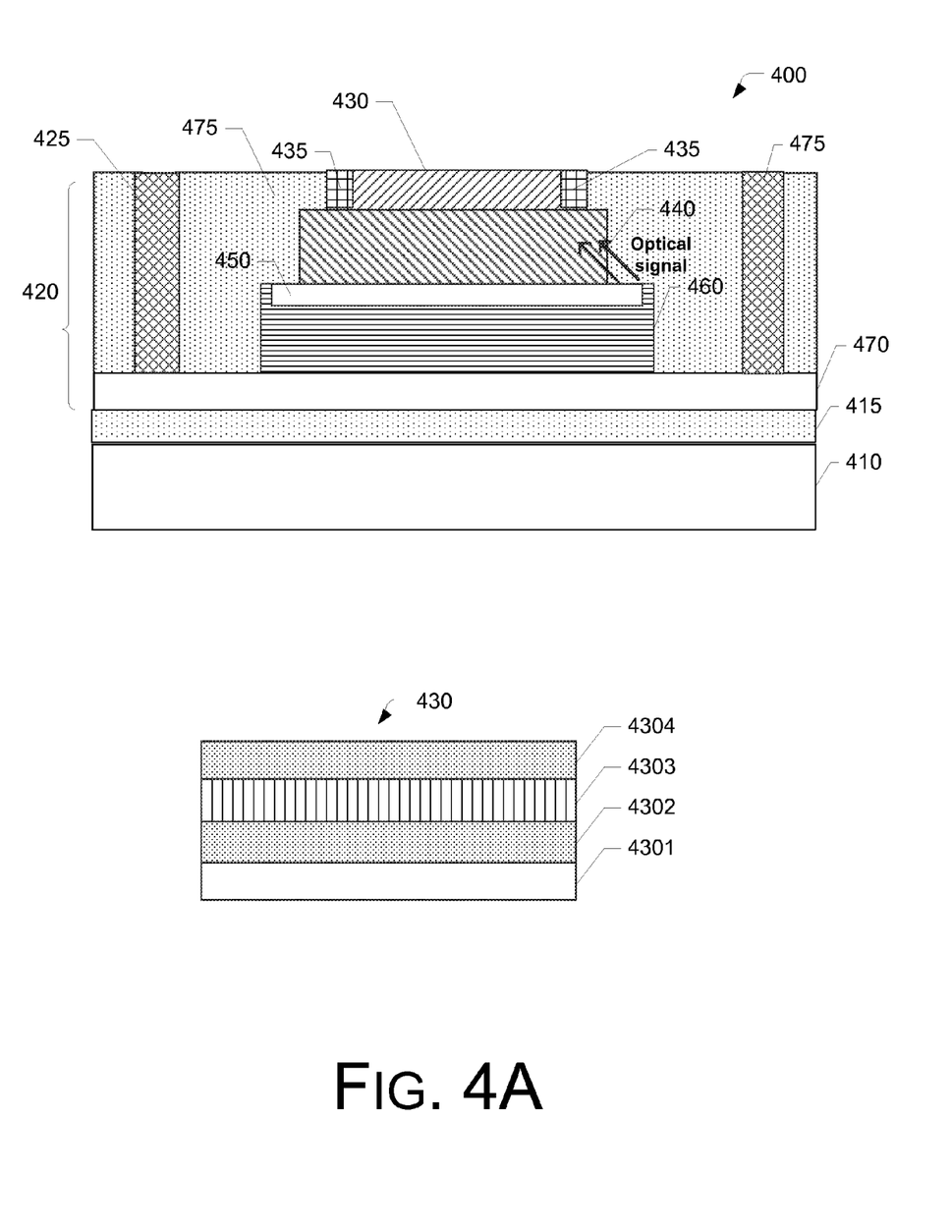
FIG. 4A is a cross-sectional view of an APD in accordance with some embodiments of the present disclosure.

FIG. 4A is a cross-sectional view of an APD 400 in accordance with an embodiment of the present disclosure. Referring to FIG. 4A, the APD 400 may comprise a substrate 410 and a multi-layer structure 420 disposed on the substrate 410. The substrate 410 is a SOI substrate with a buried oxide (BOX) layer 415. The multi-layer structure 420 may comprise: a top stressor layer 430 electrically coupled to one or more first-type metal contacts 435 of a first electrical polarity, an absorption layer 440 on which the top stressor layer 430 is disposed, a charge layer 450 on which the absorption layer 440 is disposed, a multiplication layer 460 on which the charge layer 450 is disposed, and a contact layer 470 on which the multiplication layer 460 is disposed. One or more second-type metal contacts 475 of a second electrical polarity are electrically coupled to the contact layer 470. The second electrical polarity is opposite to the first electrical polarity. For example, the one or more first-type metal contacts 435 are p-type and the one or more second-type metal contacts 475 are n-type, or vice versa. The APD 400 may further comprise an oxide coating 480 that covers the multi-layer structure 420.

The top stressor layer 430 increases the tensile strain of the absorption layer 440, thus greatly enhancing optical absorption in wavelengths beyond the optical bandgap of the absorption layer 440. The top stressor layer 430 also serves as an anti-reflection layer to improve the quantum efficiency of the APD 400. The top stressor layer 430 can be a single-layer or multi-layer structure. In one embodiment, the top stressor layer 430 has a multi-layer structure comprising four layers, including an amorphous Si layer 4301 disposed on the absorption layer 440; a first $SiO_2$ layer 4302 disposed on the amorphous Si layer 4301; a SiN layer 4303 disposed on the first $SiO_2$ layer 4302; and a second $SiO_2$ layer 4304 disposed on the SiN layer 4303. The amorphous Si layer is electrically coupled to the one or more first-type metal contacts 435.

The absorption layer 440 can be an intrinsic semiconductor layer or a semiconductor layer doped with first-type dopants. The doping concentration of the first-type dopants is controlled such that a graded doping profile of the first-type dopants is formed within the absorption layer 440. For example, the first-type dopants are p-type dopants.

In one embodiment, the absorption layer 440 includes Ge, GeSi, or SiGeC. In one embodiment, the charge layer 450 includes p-type Si, p-type GeSi, or p-type SiGeC. In one embodiment, the multiplication layer 460 includes intrinsic Si, or lightly doped n-type Si. In one embodiment, the contact layer 470 includes n-type Si. In one embodiment, the substrate 410 includes a Si substrate or an SOI substrate. In one embodiment, the p-type dopants include gallium (Ga) or boron (B).

Figure 4B:
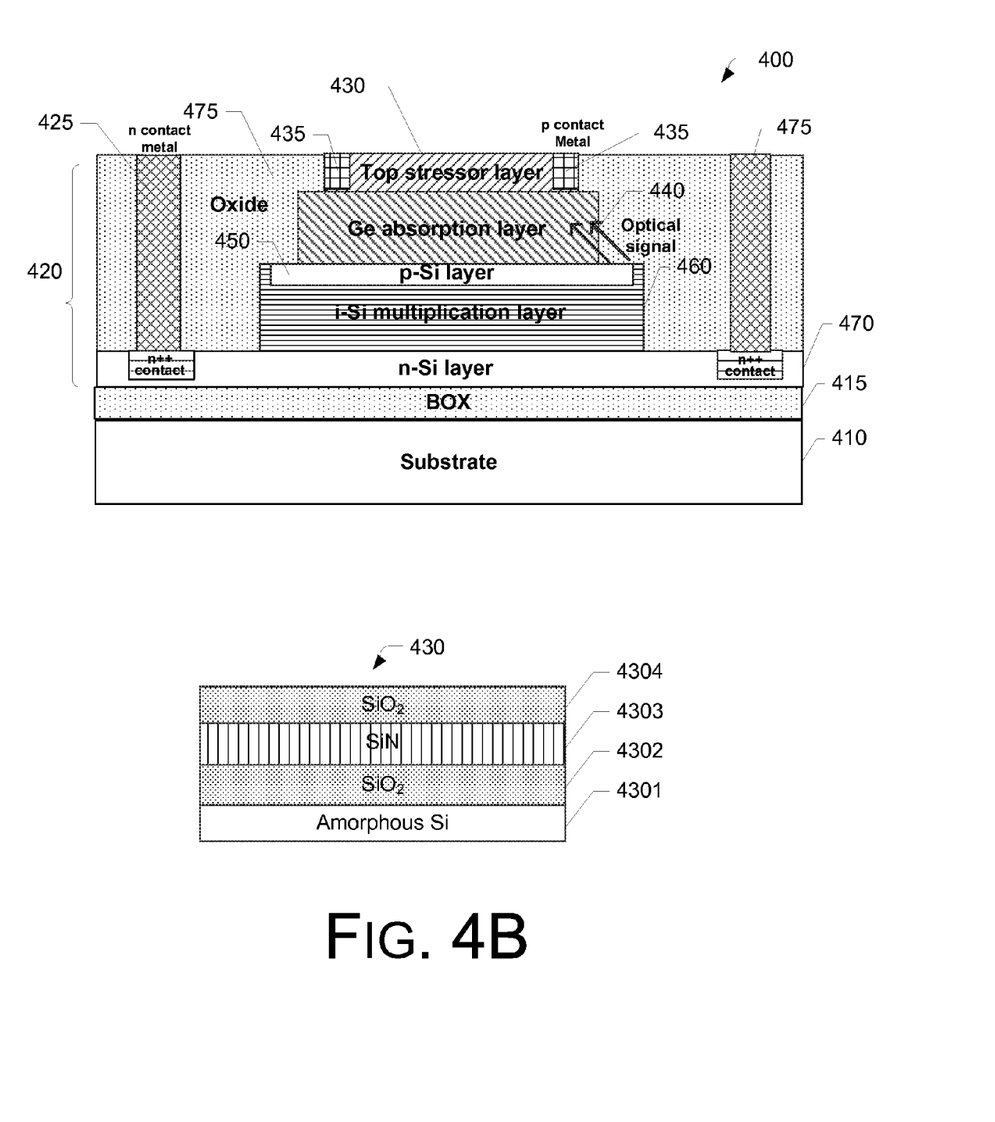
FIG. 4B is a cross-sectional view of an APD in accordance with an exemplary embodiment of the present disclosure.

FIG. 4B illustrates an exemplary embodiment of the APD 400. In the illustrated embodiment, the substrate 410 is a SOI substrate with BOX 415, the top stressor layer 430 is electrically coupled to two p-type metal contacts 435, the absorption layer 440 is a Ge absorption layer, the charge layer 450 is a p-type Si layer, the multiplication layer 460 is a Si multiplication layer, and the contact layer 470 is an n-type Si layer. The contact layer 470 is electrically coupled to two n-type metal contacts 475.

The APD 400 in accordance with FIGS. 4A-4B can operate under lateral incident illumination condition like a waveguide device. The light beam is incident laterally at the junction of the absorption layer 440 and the charge layer 450 of the APD 400. Normally, the dark currents in APDs are proportional to the size of the area of the absorption layer. Since a waveguide device typically has a much smaller size than a normal incident device, the design of the present disclosure can reduce dark currents in GeSi APDs. In addition, a waveguide device according to the present disclosure also has a broader absorption coverage resulted from its lateral incident illumination and a better bandwidth resulted from its smaller capacitance. As a result, the device performance can be greatly enhanced.

Exemplary Test Results

Raman spectra and absorption spectra of a bulk Ge layer and a Ge layer having top stressor layers in accordance with the present disclosure were measured to study the effects of the top stressor layer on the optical properties of Ge. In this study, the top stressor layer has a four-layer structure, including an amorphous Si layer disposed on the Ge absorption layer; a first $SiO_2$ layer disposed on the amorphous Si layer; a SiN layer disposed on the first $SiO_2$ layer; and a second $SiO_2$ layer disposed on the SiN layer.

Figure 5:
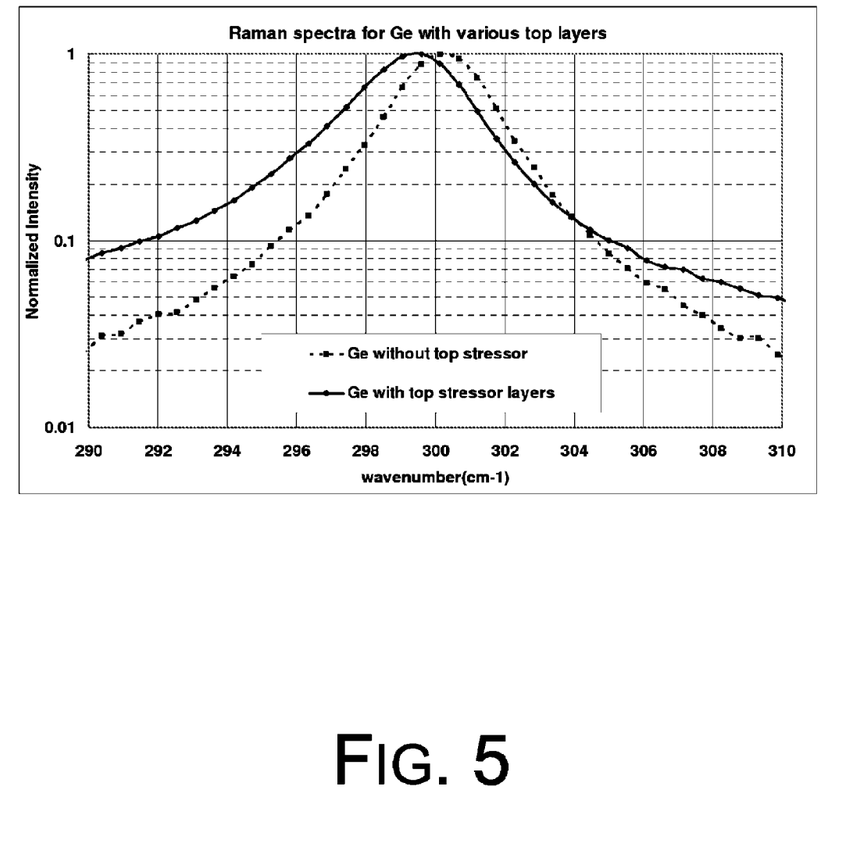
FIG. 5 are graphs comparing Raman spectra of a bulk Ge layer and a Ge layer having top stress layers in accordance with the present disclosure.

FIG. 5 shows graphs comparing Raman spectra of a bulk Ge layer and a Ge layer having top stressor layers in accordance with the present disclosure. The Ge Raman spectra peaks are at 300.4 $cm^{-1}$ and 299.3 $cm^{-1}$ for the bulk Ge layer and the Ge layer having top stressor layers, respectively. The difference in Raman spectra peaks indicates that the top stressor layers can increase tensile strain inside the Ge layer.

Figure 6:
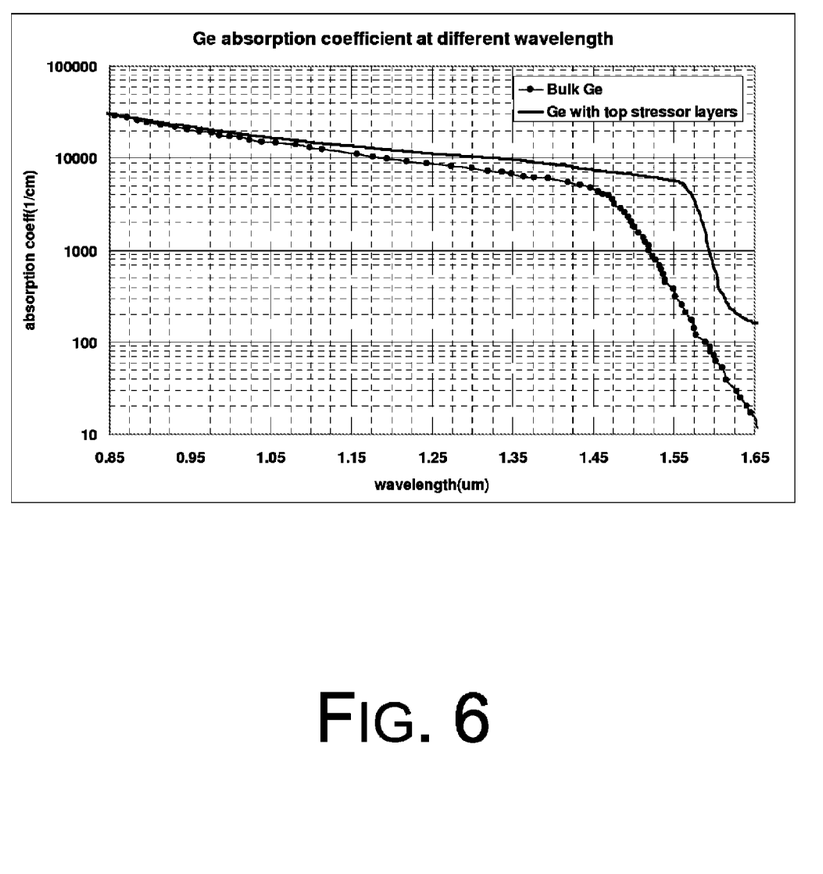
FIG. 6 are graphs comparing absorption spectra of a bulk Ge layer and a Ge layer having top stress layers in accordance with the present disclosure.

FIG. 6 shows graphs comparing absorption spectra of a bulk Ge layer and a Ge layer having top stressor layers in accordance with the present disclosure. The Ge layer having top stressor layers has much higher absorption coefficient between 1500 nm to 1600 nm than those of the bulk Ge layer. The absorption spectra clearly show that the bulk Ge layer cannot efficiently absorb the light with wavelengths beyond 1550 nm, while the Ge layer with top stressor layers not only extends the absorption edge to ~1600 nm but also greatly increase the absorption coefficient at 1550 nm.

Although some embodiments are disclosed above, they are not intended to limit the scope of the present disclosure. It will be apparent to those skilled in the art that various modifications and variations can be made to the disclosed embodiments of the present disclosure without departing from the scope or spirit of the present disclosure. In view of the foregoing, the scope of the present disclosure shall be defined by the following claims and their equivalents.

What is claimed is:

1. An avalanche photodiode, comprising:
   a substrate; and
   a multi-layer structure disposed on a first surface of the substrate, comprising:
      at least one top stressor layer including an amorphous silicon (Si) layer, the at least one top stressor layer coupled to at least one metal contact of a first electrical polarity;
      a germanium (Ge)-containing absorption layer on which the at least one top stressor layer is disposed;
      a charge layer on which the Ge-containing absorption layer is disposed;
      a multiplication layer on which the charge layer is disposed; and
      a contact layer on which the multiplication layer is disposed, the contact layer coupled to at least one metal contact of a second electrical polarity opposite to the first electrical polarity,
      wherein the at least one top stressor layer is configured to increase a tensile strain in the Ge-containing absorption layer such that absorption of the Ge-containing absorption layer between 1550 nm and 1650 nm is increased.

2. The avalanche photodiode of claim 1, wherein the at least one top stressor layer further comprises:
   a first silicon dioxide ($SiO_2$) layer disposed on the amorphous Si layer;
   a silicon nitride (SiN) layer disposed on the first $SiO_2$ layer; and
   a second $SiO_2$ layer disposed on the SiN layer.

3. The avalanche photodiode of claim 1, wherein the Ge-containing absorption layer comprises Ge, germanium-silicon (GeSi), or silicon-germanium-carbon (SiGeC).

4. The avalanche photodiode of claim 1, wherein the charge layer comprises p-type Si, p-type GeSi, or p-type SiGeC.

5. The avalanche photodiode of claim 1, wherein the multiplication layer comprises intrinsic Si or lightly doped n-type Si.

6. The avalanche photodiode of claim 1, wherein the contact layer comprises n-type Si.

7. The avalanche photodiode of claim 1, wherein the substrate comprises a Si substrate or a silicon-on-insulator (SOI) substrate.

8. The avalanche photodiode of claim 1, further comprising:
   at least one anti-reflection layer disposed on a second surface of the substrate opposite to the first surface,
   wherein the at least one anti-reflection layer comprises a single $SiO_2$ layer or three layers comprising a SiN layer disposed between two $SiO_2$ layers.

9. The avalanche photodiode of claim 1, wherein the Ge-containing absorption layer further comprises p-type dopants, a doping concentration of the p-type dopants is controlled such that a graded doping profile of the p-type dopants is formed within the Ge-containing absorption layer.

10. The avalanche photodiode of claim 9, wherein the p-type dopant comprises gallium (Ga) or boron (B).

11. An avalanche photodiode, comprising:
    a substrate; and
    a multi-layer structure disposed on a first surface of the substrate, comprising:
       at least one top stressor layer including an amorphous silicon layer, the at least one top stressor layer coupled to at least one metal contact of a first electrical polarity;
       a germanium (Ge) absorption layer on which the at least one top stressor layer is disposed;
       a charge layer on which the Ge absorption layer is disposed;
       a multiplication layer on which the charge layer is disposed; and
       a contact layer on which the multiplication layer is disposed, the contact layer coupled to at least one metal contact of a second electrical polarity opposite to the first electrical polarity,
       wherein the at least one top stressor layer is configured to increase a tensile strain in the Ge absorption layer such that absorption of the Ge absorption layer between 1550 nm and 1650 nm is increased.

12. The avalanche photodiode of claim 11, wherein the at least one top stressor layer further comprises:
    a first silicon dioxide $SiO_2$ layer disposed on the amorphous Si layer;
    a silicon nitride (SiN) layer disposed on the first $SiO_2$ layer; and
    a second $SiO_2$ layer disposed on the SiN layer.

13. The avalanche photodiode of claim 11, wherein the charge layer comprises p-type Si, p-type GeSi, or p-type SiGeC, wherein the multiplication layer comprises intrinsic Si or lightly doped n-type Si, and wherein the contact layer comprises n-type Si.

14. The avalanche photodiode of claim 11, wherein the substrate comprises a Si substrate or a silicon-on-insulator (SOI) substrate.

15. The avalanche photodiode of claim 11, further comprising at least one anti-reflection layer disposed on a second surface of the substrate opposite to the first surface, wherein the at least one anti-reflection layer comprises a single SiO2 layer or three layers comprising a SiN layer disposed between two SiO2 layers.

16. The avalanche photodiode of claim 11, wherein the Ge absorption layer further comprises p-type dopants, a doping concentration of the p-type dopants is controlled such that a graded doping profile of the p-type dopants is formed within the Ge absorption layer.

17. The avalanche photodiode of claim 16, wherein the p-type dopant comprises gallium (Ga) or boron (B).

18. An avalanche photodiode, comprising:
    a substrate;
    a multi-layer structure disposed on the substrate, comprising:
       at least one top stressor layer including an amorphous silicon layer, the at least one top stressor layer coupled to at least one metal contact of a first electrical polarity;
       a germanium (Ge)-containing absorption layer doped with p-type dopants on which the at least one top stressor layer is disposed, a doping concentration of the p-type dopants is controlled such that a graded doping profile of the p-type dopants is formed within the Ge-containing absorption layer;
       a charge layer on which the Ge-containing absorption layer is disposed;
       a multiplication layer on which the charge layer is disposed; and a contact layer on which the multiplication layer is disposed, the contact layer coupled to at least one metal contact of a second electrical polarity opposite to the first electrical polarity, wherein the at least one top stressor layer is configured to increase a tensile strain in the Ge-containing absorption layer such that absorption of the Ge-containing absorption layer between 1550 nm and 1650 nm is increased.

19. The avalanche photodiode of claim 18, wherein the at least one top stressor layer further comprises:
a first silicon dioxide ($SiO_2$) layer disposed on the amorphous Si layer;
a silicon nitride (SiN) layer disposed on the first $SiO_2$ layer; and
a second $SiO_2$ layer disposed on the SiN layer.

20. The avalanche photodiode of claim 18, wherein the Ge-containing absorption layer comprises Ge, germanium-silicon (GeSi), or silicon-germanium-carbon (SiGeC), and wherein the p-type dopant comprises gallium (Ga) or boron (B).

* * * * *